United States Patent [19]
Houng et al.

[11] Patent Number: 6,004,886
[45] Date of Patent: Dec. 21, 1999

[54] LIQUID PHASE DEPOSITION METHOD FOR FORMING SILICON DIOXIDE FILM ON HGCDTE OR OTHER II-VI SEMICONDUCTOR SUBSTRATE

[75] Inventors: Mau-Phon Houng; Yeong-Her Wang; Na-Fu Wang, all of Tainan, Taiwan

[73] Assignee: National Science Council, Taipei, Taiwan

[21] Appl. No.: 08/960,913

[22] Filed: Oct. 30, 1997

[51] Int. Cl.⁶ .......................... H01L 21/31; H01L 21/469
[52] U.S. Cl. .......................... 438/779; 438/778; 438/787; 438/782
[58] Field of Search .................... 438/779, 787, 438/102, 584, 483, 586, 590, 602, 603, 759, 782, 778; 427/430.1, 397.7, 397.8, 443.2

[56] References Cited

PUBLICATIONS

Houng, M. et al. Near–Room Temperature Growth of SiO2 Films for p–HgCdTe Passivation by Liquid Phase Deposition. Japanese Journal of Applied Physics. vol. 36, Part 2, No. 6A. pp. L696–L698, Jun. 1, 1997.

Homma, T. et al. A New Interlayer Formation Technology for Completely Planarized Multilevel Interconnection by Using LPD. 1990 Symposium on VLSI Technology. pp. 3–4, Jun. 1990.

Yeh, C. et al. Novel Technique for SiO2 Formed by Liquid Phase Deposition for Low Temperature Processed Polysilicon TFT. IEEE Electron Device Letters. vol. 14, No. 8. pp. 403–405, Aug. 1993.

Chou, J. et al. The Initial Growth Mechanism of Silicon Oxide by Liquid–Phase Deposition. Journal Electrochemical Society. vol. 141, No. 11. pp. 3214–3217, Nov. 1994.

Ghandi, S. VLSI Fabrication Principles. John Wiley & Sons, Inc. pp. 517–520, Jan. 1983.

Janousek et al., "Photochemical oxidaton of (Hg, Cd)Te: Passivation processes and characteristics", J.Vac.Sci.Technol. A 3(1) p 195 (1985).

Janousek et al., "Passivation properties and interfacial chemistry of photochemically deposited $SiO_2$ on $Hg_{0.7}Cd_{0.30}Te$", J.Vac.Sci.Technol. A 1 p 7 (1994).

Lin et al., "Passivation with $SiO_2$ on HgCdTe by direct photochemical–vapor deposition", J.Vac.Sci.Technol. A12 p 7 (1994).

Wagner et al., "Surface characterization of $Hg_{0.7}Cd_{0.30}Te$ native oxides" J.Vac.Sci.Technol. A3 p 212 (1985).

Wilson et al., "Electrical properties of the $SiO_2$:HgCdTe interface", J.Vac.Sci.Technol. A3, p 199 (1985).

*Primary Examiner*—Olik Chaudhuri
*Assistant Examiner*—Ginette Peralta
*Attorney, Agent, or Firm*—Fish & Richardson P.C.

[57] ABSTRACT

A method for growing a silicon dioxide film on a HgCdTe substrate includes a first step in which the HgCdTe substrate is cleaned with an alkaline aqueous solution. The cleaned HgCdTe substrate is then dried before being immersed in a liquid phase deposition solution in which the silicon dioxide film is deposited on the surface of the HgCdTe substrate at the rate as high as 1672 Å/hr. The silicon dioxide film has a refraction rate as high as 1.465.

15 Claims, 7 Drawing Sheets

LIQUID PHASE DEPOSITION METHOD FOR FORMING SILICON DIOXIDE FILM ON HGCDTE OR OTHER II-VI SEMICONDUCTOR SUBSTRATE

FIELD OF THE INVENTION

The present invention relates generally to a method for forming a silicon dioxide film on a II-VI semiconductor substrate, and more particularly to a liquid phase deposition method for forming a silicon dioxide film on a HgCdTe or other II-VI semiconductor substrate.

BACKGROUND OF THE INVENTION

The $Hg_{1-x}Cd_xTe$ semiconductor material is vital to the research and the manufacture of the far-infrared photo-detector in view of the fact that the bandgap of this material ranges between 0.11 and 0.25 eV when x=0.2–0.3 and under the circumstance of 77K. This material is especially suitable for making a far-infrared photo-detector for the wavelength sections of 3~5 $\mu$m and 8~12 $\mu$m. However, the surface of this ternary semiconductor material has a high chemical reactivity as well as the unstable chemical and electrical structures. As a result, an excellent surface passivation is called for in the manufacture of the IR element capable of excellent performances.

The excellent surface passivation must meet the following requirements:

(1) INTERFACE PROPERTIES:
   a. high breakdown electric field
   b. small leakage current
   c. low interface energy state density
   d. low surface recombination velocity (2) DIELECTRIC PROPERTIES:
   a. good insulator
   b. excellent adhesion
   c. thermal stability
   d. exhibition of radiation hardening So far as the above requirements are concerned, a number of research papers dealing with the surface passivation layers of the HgCdTe material have been disclosed so far, as exemplified by CdS, CdTe, ZnS, anodic oxide, anodic sulfide, anodic fluoride, plasma oxide and $SiO_2$ [B. K. Janousek, and R. C. Carscallen, J. Vac. Sci. Technol. A3, p 195, (1985); J. A. Wilson and V. A. Cotton, J. Vac. Sci. Technol. A3, p 199, (1985); J. F. Wager and D. R. Rhiger, J. Vac. Sci. Technol. A3, p 212, (1985); B. K. Janousek, R. C. Carscallen, and P. A. Bertrand, J. Vac. Sci. Technol. A1, p1723, (1983); J. D. Lin, Y. K. Su, S. J. Chang, M. Yokoyama, and F. Y. Juang, J. Vac. Sci. Technol. A12, p 7 (1994).]

In addition to the surface passivation, other important aspects of the subject matter include the stable state of the homogeneous stoichiometric composition of the surface of the HgCdTe material, the cryogenic deposition technique, and the pre-deposition treatment of the HgCdTe material surface. In order to avert the damaging effect of an excessively high temperature on the surface of the HgCdTe material, the electrochemical method was generally employed for forming the anodic oxide films in the early research. The films formed by the electrochemical method are poor in interface properties, thermal stability and repeatability. Moreover, the electrochemical method must be carried out at a treatment temperature of 60° C. or higher and is therefore incapable of forming a good surface passivation.

In view of the drawbacks of the electrochemical method described above, the chemical vapor deposition (called CVD for short) was introduced for forming the silicon dioxide ($SiO_2$) film on the HgCdTe substrate. The HgCdTe material is rather sensitive to temperature and is therefore very vulnerable to damage caused by the high temperature. In other words, the chemical structure of the HgCdTe surface can be easily destroyed by a temperature in excess of 100° C. On the other hand, if the temperature is too low, the HgCdTe surface is devoid of sufficient energy to decompose the gases of $SiH_4$ and oxygen in CVD method. As a result, the photo-CVD method must be used in place of the CVD method. The photo-CVD method makes use of the Hg and the $D_2$ lamps for generating a strong radiation energy in the spectrum range of violet radiation and ultraviolet radiation. The radiation energy is used as a catalyst for accelerating the process of decomposing the $SiH_4$ gas and the oxygen gas. However, the growth of the silicon dioxide film on the HgCdTe substrate by the photo-CVD method takes place at an undesired temperature ranging between 60° C. and 100° C. In addition, the photo-CVD method needs an expensive vacuum equipment.

SUMMARY OF THE INVENTION

The primary objective of the present invention is therefore to provide an unconventional method capable of overcoming the shortcomings of the conventional methods described above. The unconventional method of the present invention makes use of the technique of liquid phase deposition (LPD) for growing the silicon dioxide ($SiO_2$) film on the HgCdTe substrate or other II-VI substrate. The LPD technique has been used successfully for growing the silicon dioxide film on the silicon substrate.

In keeping with the principle of the present invention, the foregoing objective of the present invention is attained by a liquid phase deposition method for forming a silicon dioxide film on a II-VI semiconductor substrate. The method of the present invention includes a first step in which the II-VI semiconductor substrate is cleaned. After being cleaned, the II-VI semiconductor substrate is immersed in an aqueous alkaline solution and is then removed from the aqueous alkaline solution for forming thereon the silicon dioxide film by the LPD technique.

The method of the present invention is suitable for use in forming the silicon dioxide film on the II-VI semiconductor substrate, such as the HgCdTe substrate.

Preferably, the aqueous alkaline solution used in the method of the present invention has a pH value ranging between 10 and 12. The examples of the aqueous alkaline solution are aqueous ammonia solution, buffered aqueous ammonia solution, and aqueous hydrogen peroxide solution. The aqueous ammonia solution and the buffered aqueous ammonia solution are preferable.

The process of immersing the semiconductor substrate in the aqueous alkaline solution and the process of forming the silicon dioxide film on the semiconductor substrate by the LPD technique are carried out at a temperature ranging between 10° C. and 50° C., preferably the room temperature, 20–25° C. The time for immersing the semiconductor substrate in the aqueous alkaline solution preferably ranges between 0.1 minute and 10 minutes.

The semiconductor substrate is preferably cleaned by washing with one or more organic solvents, and deionized water in sequence followed by drying in an atmosphere of an inert gas. The semiconductor substrate is then etched by a bromine methanol solution and washed with the pure methanol before being dried in an atmosphere of an inert gas. The bromine methanol solution preferably contains 0.5–3.0% by volume of bromine. In the meantime, the bromine methanol solution etching lasts between 0.1 minutes and 5 minutes.

The liquid phase deposition of the method of the present invention takes place in a supersaturated hydrofluosilicic acid aqueous solution, which contains the hydrofluosilicic acid ($H_2SiF_6$) in a concentration ranging between 1.3 M and 2.2 M, as well as boric acid in a concentration ranging between 0.001 M and 0.02 M, preferably between 0.0075 M and 0.02 M.

The supersaturated hydrofluosilicic acid ($H_2SiF_6$) aqueous solution is prepared by dissolving the silica powder in 2–4 M hydrofluosilicic acid aqueous solution, removing undissolved silica by filtration, and adding boric acid aqueous solution and selectively water to the filtrate.

The present invention also discloses a semiconductor device, which comprises a HgCdTe substrate, a silicon dioxide passivation layer and an interface layer between the HgCdTe substrate and the silicon dioxide passivation layer. The silicon dioxide passivation layer contains Si—F bonds. The interface layer is formed of the oxides of Cd and Te. Preferably, the silicon dioxide passivation layer has a refractive index in the range of 1.37–1.47.

DETAILED DESCRIPTION OF THE EMBODIMENTS

Figure 1:
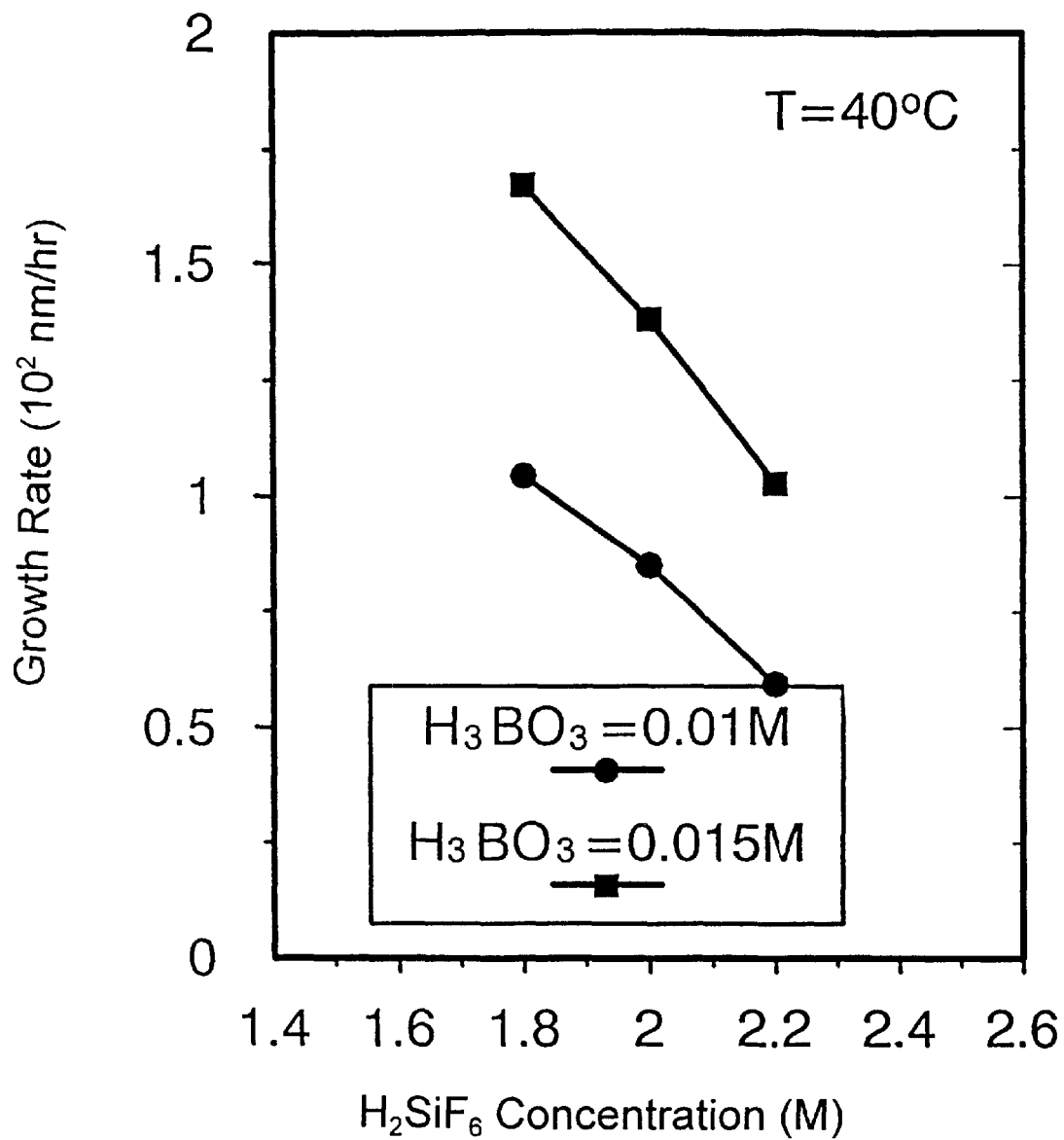
FIG. 1 shows a plot illustrating the relationship between the $H_2SiF_6$ concentration of the liquid phase deposition solution of the method of the present invention and the deposition rate of $SiO_2$. The boric acid concentrations of 0.01M and 0.015M are denoted respectively by the lines -■- and -●-.

A preferred embodiment of the present invention made use of a HgCdTe/CdTe substrate (called HgCdTe substrate for short). In other words, a p-type HgCdTe layer was formed by the liquid phase epitaxy (LPE) method on a CdTe wafer having a (111) orientation.

The quality of the surface passivation layer depends on the quality of the HgCdTe surface. It is therefore essential that the HgCdTe surface must be controlled strictly. The following steps were involved in the growth of the silicon dioxide layer as the surface passivation layer in the preferred embodiment of the present invention.

(A) cleaning the HgCdTe substrate:
(1) placing the substrate in trichloroethane for 6 minutes;
(2) placing the substrate in acetone for 6 minutes;
(3) placing the substrate in methanol for 6 minutes; and (The steps (1)–(3) were carried out in an ultrasonic vibrator.)
(4) washing the substrate with deionized water and drying the substrate with $N_2$.

(B) etching the HgCdTe substrate:
(1) placing the substrate in a methanol solution with 1 vol % bromine for one minute;
(2) cleaning the substrate in the methanol solution; and
(3) washing the substrate with deionized water and drying the substrate with $N_2$.

(C) treating the surface of the HgCdTe substrate for forming a thermodynamically stable native oxide interface suitable for growing a $SiO_2$ film by LPD method:
(1) immersing the HgCdTe substrate in a 0.0333M ammonia aqueous solution having pH=10–12, for a surface treatment lasting 5 minutes; and
(2) drying the substrate with $N_2$.

(D) growing a $SiO_2$ film on the treated HgCdTe substrate in a LPD solution. The LPD conditions and results of the preferred embodiments of the present invention are described hereinafter.

In the above process (B), the HgCdTe substrate was etched in the 1 vol % bromine methanol solution to avert the unstable native oxide originally formed on the substrate surface and the contamination on the substrate surface. Upon making contact with the atmospheric air, the substrate surface reacts with air to form thereon the unstable native oxide. As a result, the cleaning and the etching processes are indispensable. However, the nature of the etching solution depends on the nature of the substrate. As for as the HgCdTe substrate is concerned, a bromine methanol solution is generally used as the etching solution. The bromine methanol solution is prepared by mixing pure methanol with bromine water so that 0.5–3.0 vol % of bromine water is contained in the mixture. The nature of the components of the native oxide interface formed in step (C) depends on the bromine content.

The preferred embodiment of the present invention made use of 1 vol % of bromine methanol solution for etching the HgCdTe substrate surface. After being etched, the substrate surface had a Te-rich characteristic. As a result, the chip surface was capable of reacting with air to form $TeO_2$ so that the chemical composition of the HgCdTe substrate surface became unstable and the interfacial band-gap density was increased. The removal of the residual Te component from the surface of the HgCdTe substrate was attained by subjecting the HgCdTe surface to the treatment of the ammonia aqueous solution having pH=10–12, thereby enabling the HgCdTe surface to maintain its chemical stability. Moreover, it is difficult to grow the $SiO_2$ film on a clean substrate by the LPD method in view of the fact that the clean substrate is devoid of nuclides. A better environment for promoting the growth of LPD-$SiO_2$ film on a substrate surface can be achieved by subjecting the substrate surface to a chemical treatment capable of increasing the number of $OH^-$ groups on the substrate surface. In the preferred embodiment of the present invention, the HgCdTe surface was subjected to the ammonia water treatment such that a chemically stable native oxide was formed on the HgCdTe surface. The native oxide can act as a medium for promoting the growth of the LPD-$SiO_2$.

The LPD solution was prepared by mixing silicic acid ($SiO_2$:$xH_2O$) with 34% $H_2SiF_6$ aqueous solution to form a mixture solution, which was stirred for several hours at the room temperature to form a saturated $H_2SiF_6$ aqueous solution. The saturated $H_2SiF_6$ aqueous solution was mixed with water and $H_3BO_3$ to form a supersaturated $H_2SiF_6$ aqueous solution, in which a silicon dioxide film was formed by deposition on the ammonia-treated HgCdTe substrate immersed, as illustrated by the following chemical equations.

$$\Delta H + H_2SiF_6 + 2H_2O \leftrightharpoons 6HF + SiO_2 \quad (1)$$

$$H_3BO_3 + 4HF \leftrightharpoons BF_4^- + H_3O^+ + 2H_2O \quad (2)$$

The mechanism of forming the silicon dioxide is controlled by the above equations (1) and (2). The equation (1) is an endothermal reaction. The growth rate can be accelerated by adjusting $H_2SiF_6$ concentration, $H_3BO_3$ concentration, and growth temperature. From the black round dot curve of FIG. 1, it could be seen that the growth rate was changed as $H_2SiF_6$ concentration changes under the conditions that $H_3BO_3$=0.01M and growth temperature=40° C. The greatest growth rate of 1043 Å/hr was attained when $H_2SiF_6$=1.8M. The growth rate decreased as the concentration of $H_2SiF_6$ increased. This is because the water content in the solution was increased as the concentration of $H_2SiF_6$ was decreased, so that the equivalent point of the equation (1) is leftward, and thus the $SiO_2$ deposition is enhanced. Under the different concentrations of $H_3BO_3$, the same trend was obtained (The black square dot curve in FIG. 1 represents $H_3BO_3$ concentration=0.015 M). When the concentration of $H_3BO_3$ was from 0.01M to 0.015M, the silicon dioxide growth rate was accelerated. This can be explained from the equations (2) and (1). When the concentration of $H_3BO_3$ was increased, more HF was consumed because of the fact that $H_3BO_3$ reacted with HF to form $BF_4^-$ according to the equation (2). As a result, more $SiO_2$ was released in the solution to promote the deposition because the equivalent point of the equation (1) is leftward. The greatest growth rate of 1672 Å/hr was attained when the $H_3BO_3$ concentration=0.015M, growth temperature=40° C., and $H_2SiF_6$=1.8M.

In FIG. 1, the LPD solution total volume was fixed at 92.7 ml. For different concentrations of $H_2SiF_6$ and $H_3BO_3$, various volumes of 0.1M $H_3BO_{3(aq)}$ and 3.09 M saturated $H_2SiF_6$ aqueous solution and water were mixed. For example, when $H_3BO_{3(aq)}$ was fixed at 0.01M, 9.27 ml of 0.1M $H_3BO_{3(aq)}$ was added to 3.09M of saturated $H_2SiF_6$ aqueous solution and water having volumes as indicated below so as to obtain various concentrations of $H_2SiF_6$:

| | | | | |
|---|---|---|---|---|
| 3.09 M $H_2SiF_{6(aq)}$ vol. (ml) = | 48 | 54 | 60 | 66 |
| water vol. (ml) = | 35.43 | 29.43 | 23.43 | 17.43 |
| obtained $H_2SiF_{6(aq)}$ conc. = | 1.6 M | 1.8 M | 2.0 M | 2.2 M |

Figure 2:
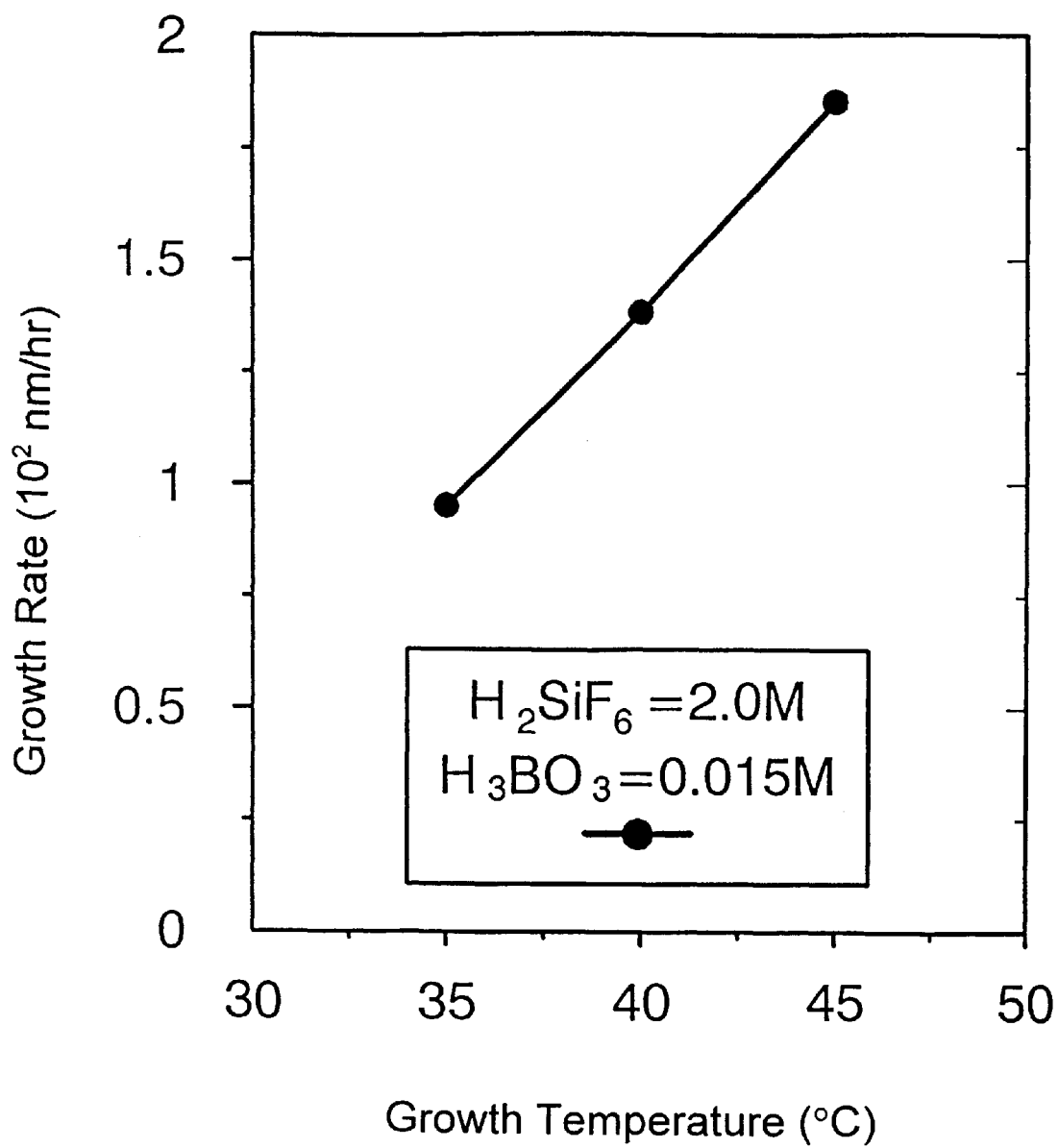
FIG. 2 shows a plot illustrating the relationship between the deposition rate and the deposition temperature (35° C.–45° C.) of the LPD method of the present invention, wherein the $H_2SiF_6$ concentration is 2.0 M and the boric acid concentration is 0.015M.

FIG. 2 shows the change in the growth rate along with the deposition temperatures (35° C.–45° C.). As the deposition temperature was increased, the growth rate became faster. The near linear relationship was exhibited in view of the fact that the reaction was controlled by the (1) equation, which was an endothermal reaction.

On the basis of the evaluation of the physical and the chemical properties of the LPD-$SiO_2$ film, the influence of the LPD-$SiO_2$ film on the electrical property of the element can be predicted. The refractive index of the LPD-$SiO_2$ film deposited on the HgCdTe surface according to the present invention was measured by an ellipsometer, with the result being that the refractive index of the LPD-$SiO_2$ film was 1.465 under the growth conditions of $H_2SiF_6$=2.0 M, $H_3BO_3$=0.015 M, and growth temperature=40° C. The refractive index of 1.465 is very close to that of the thermally-grown $SiO_2$ film. This implies that the chemical structure of the LPD-$SiO_2$ film grown by the method of the present invention is very dense, and non-porous.

Figure 3:
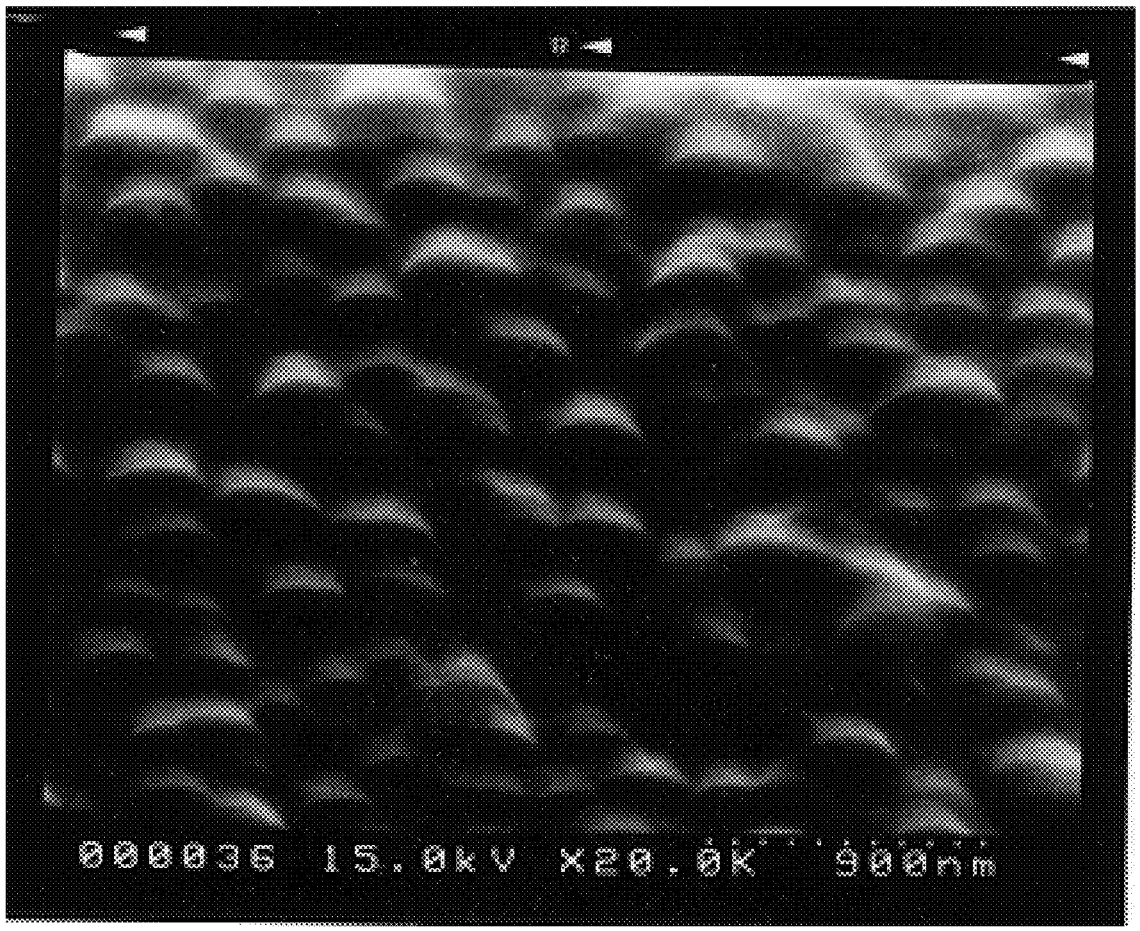
FIG. 3 shows a scan electron microscopy (SEM) of the surface morphology the silicon dioxide film grown by the present invention. This SEM was taken under the conditions of 15 KV electron beam, 20K magnification, and 30° C. inclination. The silicon dioxide film was formed in a LPD solution containing 2.0M of $H_2SiF_6$ and 0.015M of $H_3BO_3$, and at the growth temperature of 40° C.

The low-temperature LPD method was first disclosed in the present invention for its application on growing the $SiO_2$ film on the HgCdTe substrate. The surface morphology of the $SiO_2$ film must be studied. The study of the surface morphology of the $SiO_2$ film was aided by a high resolution scan electron microscope (SEM). FIG. 3 shows the surface morphology of the $SiO_2$ film grown under the conditions of $H_2SiF_6$=2.0 M, $H_3BO_3$=0.015 M, and growth temperature=40° C., wherein the surface morphology of the $SiO_2$ film was observed at the inclination of 30° by the 15 KV electron beam and the magnification of 20K. It can be seen from FIG. 3 that an amorphous $SiO_2$ film having a substantially homogenous structure of packed-grains and free of pores was formed. In other words, the LPD method of the present invention is capable of growing on the HgCdTe surface a silicon dioxide film of an excellent surface morphology.

Figure 4:
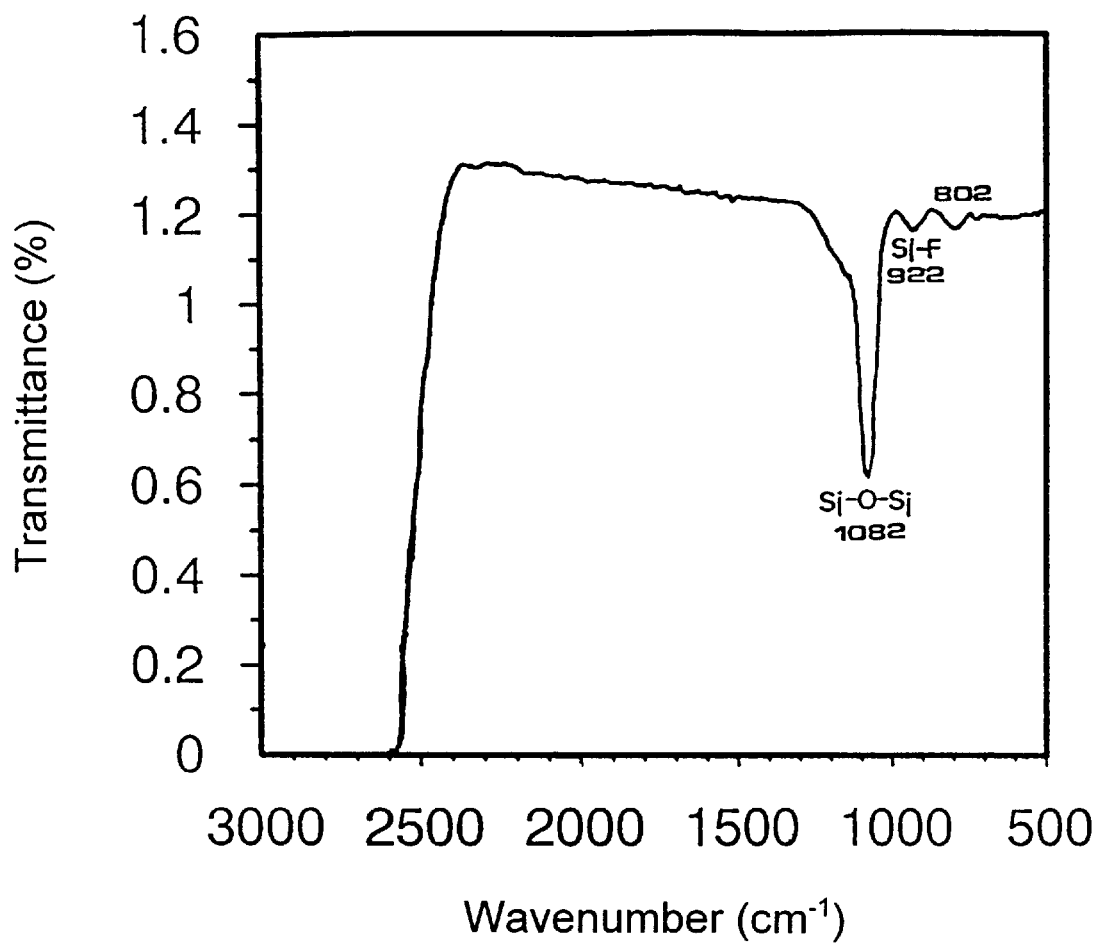
FIG. 4 shows a Fourier transform infrared (FTIR) spectrum of the HgCdTe substrate having the $SiO_2$ film formed thereon by the method of the present invention, with the growth conditions being: $H_2SiF_6$ concentration=2.0M; $H_3BO_3$ concentration=0.015 M; growth temperature=40° C.; and the thickness of the $SiO_2$ film=1390 Å.

The SEM study showed that there were grains deposited on the surface of the HgCdTe substrate. A further study was done by means of FTIR (Fourier transform infrared) to confirm the composition of the deposited film. FIG. 4 shows a FTIR spectrum of a LPD-$SiO_2$ film grown by the method of the present invention, wherein the LPD-$SiO_2$ film had a thickness of 1390 Å and was grown under the conditions of $H_2SiF_6$=2.0 M, $H_3BO_3$=0.015 M, and growth temperature= 40° C. The FTIR spectrum shows that there were two absorption bands at 1082 $cm^{-1}$ and 802 $cm^{-1}$ due to stretching and bending vibration of Si—O—Si bond. There was an absorption band at 922 $cm^{-1}$ due to Si—F stretching bond. The $SiO_2$ film was shown to have a strong Si—O—Si absorption band at 1082 $cm^{-1}$, indicating that its characteristic was similar to that of the thermal silicon dioxide spectrum, and that the LPD-$SiO_2$ film of the present invention has complete Si—O—Si bonding and thus high chemical stability. The existence of the Si—F bond was due to the fact that the LPD solution contains F-ions, which were incorporated into the growth of the $SiO_2$ film to result in the formation of $SiO_{2-x}F_x$. In view of the presence of $F^-$, the Si—O—Si absorption bands move towards the greater wave numbers. The low-temperature technique can often result in the formation of water on the $SiO_2$ film, or Si—OH bond, or Si—H bond. The FTIR spectrum of the LPD-$SiO_2$ film of the present invention showed no presence of these two absorption bands to suggest the favorable effect of the ammonia treatment on the formation of the $SiO_2$ film on the HgCdTe surface.

Figure 5:
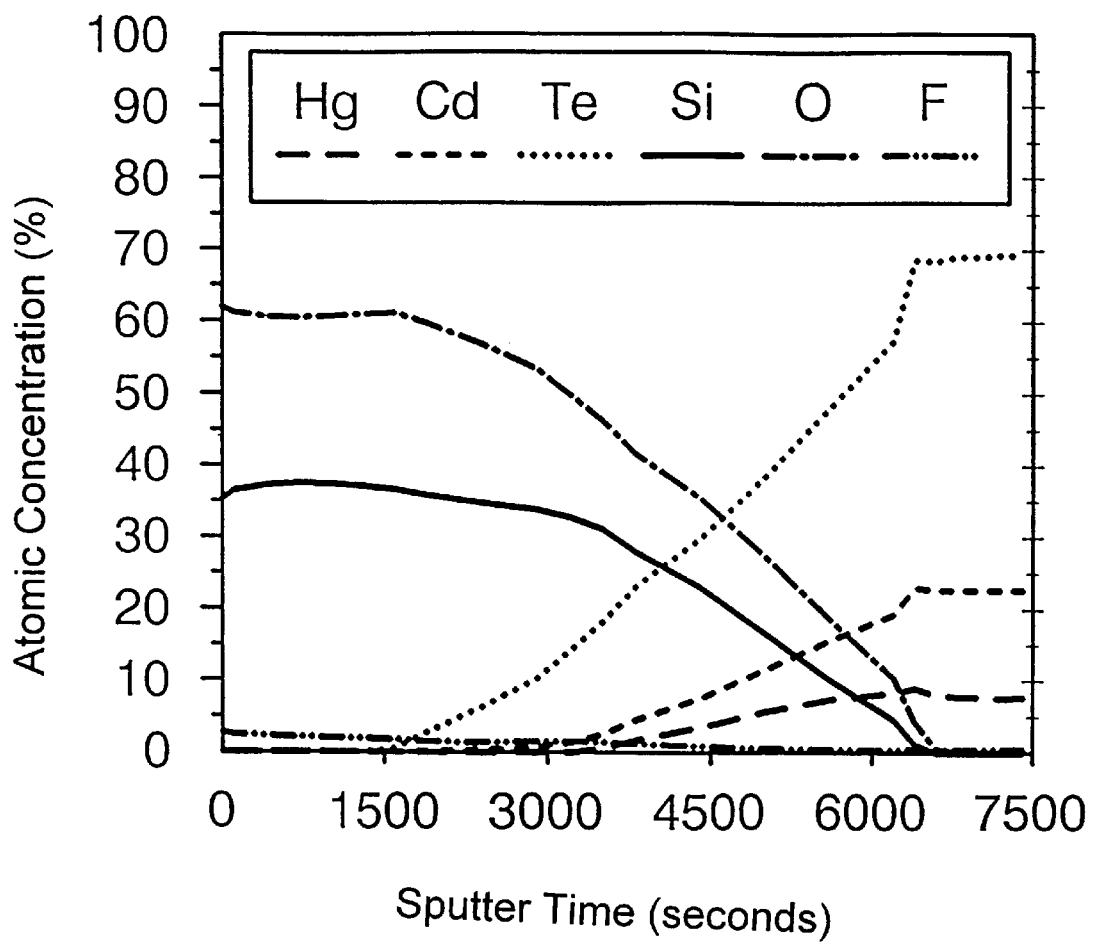
FIG. 5 shows an atomic concentration profile of the HgCdTe substrate having the $SiO_2$ film formed thereon by the method of the present invention by Auger electron spectrometer (AES). The sputtering time is indicated on the horizontal axis, whereas the atomic concentration is indicated on the longitudinal axis.

As shown if FIG. 5, the $SiO_2$ film formed on the HgCdTe surface was shown to have Si and O atoms distributed evenly therein. However, Si and O ratio was smaller than ½ in view of the presence of F atom in the LPD-$SiO_2$ film. The AES study revealed the fact that this characteristic was in agreement with the result of the FTIR study, i.e. the LPD-$SiO_2$ film had the composition of $SiO_{2-x}F_x$. The presence of F in the oxide layer enabled the surface of the HgCdTe substrate to become more resistant to radiation. The composition near the interface contained Si, O, Cd and Te atoms, wherein the Si atom had a tendency to diffuse toward the HgCdTe layer. Such interdiffusion was not serious. The HgCdTe surface was susceptible to the external influence due to its narrow bandgap, such that the chemical and the electrical characteristics thereof became unstable, and thus the quality of IR element was undermined. Such situations were especially serious when the Hg content was high. The outdiffusion of Hg was inhibited by the low-temperature LPD method of the present invention, so as to improve the characteristics of the interface and to enhance the stability of the element. Such improvement and enhancement as described above could not be attained by the photo-CVD method. A further advantage of the method of the present invention was that the ammonia treatment removed an excess amount of Te atoms from the HgCdTe surface. On the contrary, the photo-CVD method rendered the HgCdTe surface rich in Te atom, so that Te atom distributed along the AES longitudinal depth thereof and thus created an increase in the electrical charge at the interface. Cd and Te atoms were stabilized in the HgCdTe surface by the ammonia treatment of the present invention such that they were capable of forming with the oxygen atoms the stable native oxide film on the HgCdTe surface, and that a greater number of $OH^-$ groups were formed on the HgCdTe surface to facilitate the deposition.

Figure 6:
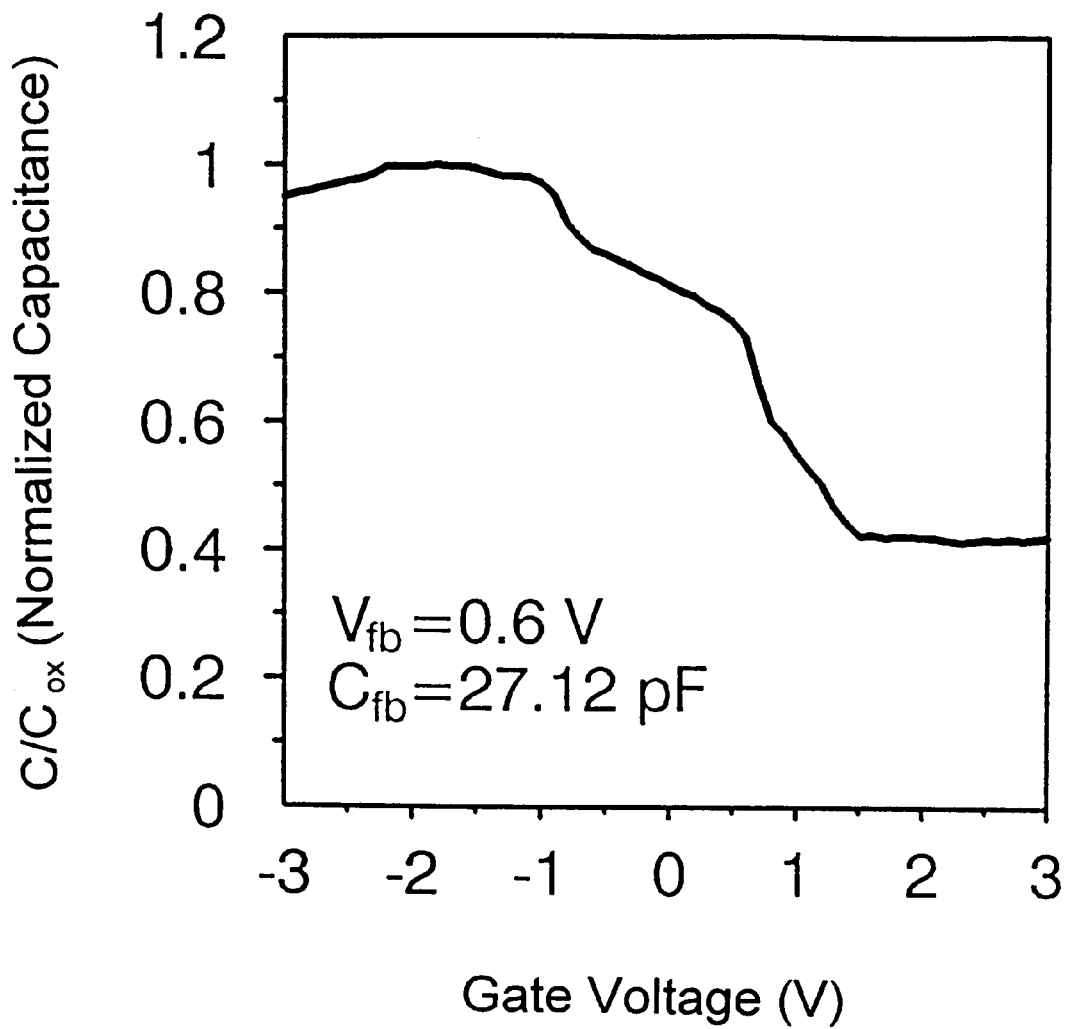
FIG. 6 shows a capacitance-voltage characteristic curve of an MOS (Al/LPD-$SiO_2$/HgCdTe) capacitor at 77K high frequency (1 MHz). The LPD-$SiO_2$ has a thickness of 1540 Å, which was formed under the conditions of the $H_2SiF_6$ concentration being 2.0M, the $H_3BO_3$ concentration being 0.015M, and the growth temperature being 40° C.
Figure 7:
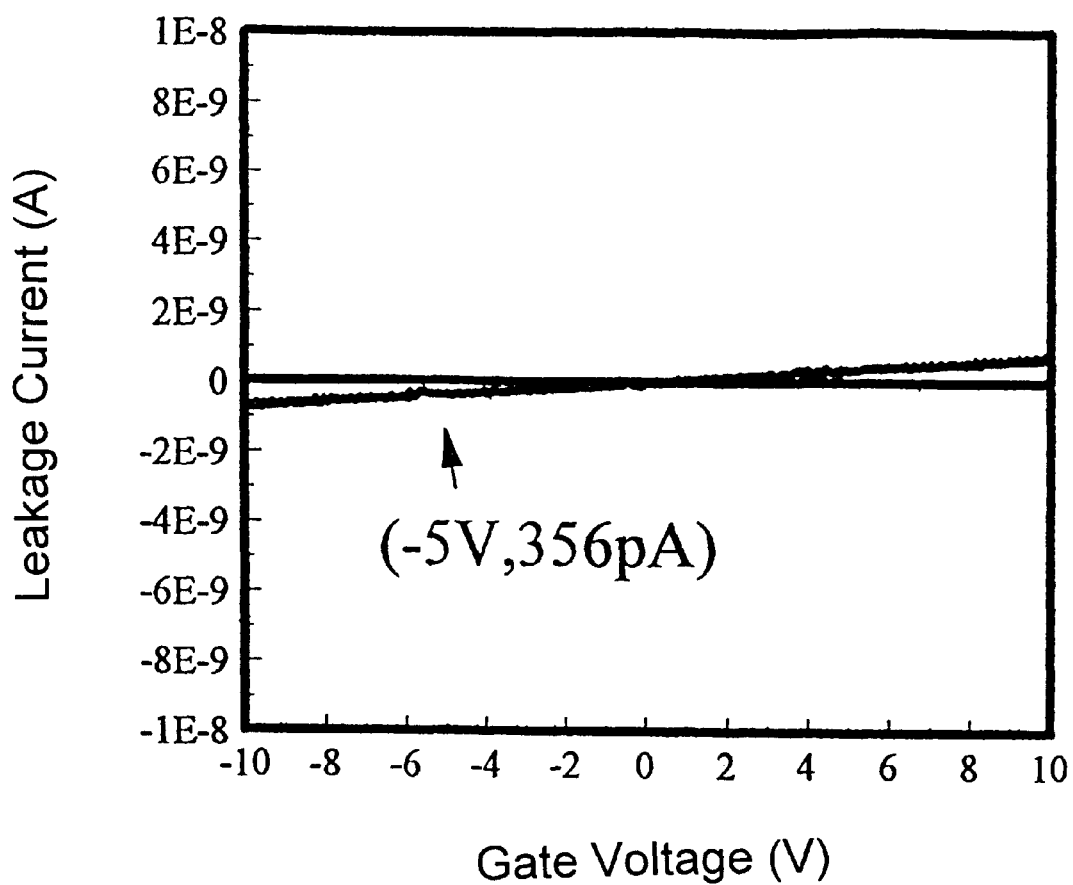
FIG. 7 shows a current-voltage characteristic curve of an MOS (Al/LPD-$SiO_2$/HgCdTe) capacitor at 77K. The LPD-$SiO_2$ has a thickness of 1540 Å, which was formed under the conditions of the $H_2SiF_6$ concentration being 2.0M, the $H_3BO_3$ concentration being 0.015M, and the growth temperature being 40° C.

The electric properties of the LPD-$SiO_2$/HgCdTe grown according to the method of the present invention were evaluated by 1 MHz capacitance-voltage (C-V) and current-voltage (I-V) curves of Al/LPD-$SiO_2$/HgCdTe/Au MOS capacitors. As shown in FIG. 6, a high frequency C-V curve was obtained under 77K. The LPD-$SiO_2$ film of the MOS capacitor having a thickness of 1540 Å was formed under the conditions of $H_2SiF_6$=2.0, $H_3BO_3$=0.015, and growth temperature=40° C. According to the C-V curve in FIG. 6, flat-band voltage was 0.6 V, the surface charge density was $-7.04\times10^{10}/cm^2$ which was lower than that obtained by the conventional method. The LPD-$SiO_2$/HgCdTe grown according to the method of the present invention was shown to have an excellent interfacial quality. In addition, the C-V curve showed that there were tow different slopes at the depletion region, which might be caused by the presence of a rapid surface energy step at the interface. As shown in FIG. 7, the I-V curve of the MOS capacitor showed that the leakage current was 356 pA, and that the maximum breakdown electric field was over 650 KV/cm when the MOS capacitor was at −5 V. This characteristics were better than those of any other method.

The embodiment of the present invention described above is to be regarded in all respects as being merely illustrative and not restrictive. Accordingly, the present invention may be embodied in other specific forms without deviating from the spirit only by the scopes of the following appended claims.

What is claimed is:

1. A liquid phase deposition method for forming a silicon dioxide film on a II-VI semiconductor substrate, said method comprising the steps of:
   (a) cleaning the II-VI semiconductor substrate;
   (b) immersing the II-VI semiconductor substrate from step (a) in an alkaline aqueous solution to increase the number of $OH^-$ groups on the substrate surface;
   (c) removing the II-VI semiconductor substrate from the alkaline aqueous solution; and
   (d) forming a silicon dioxide film on the II-VI semiconductor substrate by liquid phase deposition.

2. The method as defined in claim 1, wherein the II-VI semiconductor substrate is HgCdTe substrate.

3. The method as defined in claim 1, wherein the alkaline aqueous solution has a pH value ranging between 10 and 12.

4. The method as defined in claim 3, wherein the alkaline aqueous solution is an ammonia aqueous solution or a buffered ammonia aqueous solution.

5. The method as defined in claim 1, wherein the step (b) is carried out at 10–50° C.

6. The method as defined in claim 1, wherein the II-VI semiconductor substrate is immersed in the alkaline aqueous solution for a duration lasting between 0.1 minute and 10 minutes.

7. The method as defined in claim 1, wherein the step (a) is consisting essentially of the following steps in sequence: washing the semiconductor substrate with one or more organic solvents; washing the semiconductor substrate with deionized water; drying the semiconductor substrate in an atmosphere of an inert gas; etching the semiconductor substrate with a bromine methanol solution; washing the etched semiconductor substrate with pure methanol; and drying the semiconductor substrate in atmosphere of an inert gas.

8. The method as defined in claim 7, wherein the bromine methanol solution contains 0.5–3.0% by volume of bromine; and wherein the semiconductor substrate is etched in the bromine methanol solution for a duration lasting between 0.1 minute and 5 minutes.

9. The method as defined in claim 1, wherein the semiconductor substrate is dried by evaporation in an atmosphere of an inert gas after being removed from the alkaline aqueous solution and before the step (d) is carried out.

10. The method as defined in claim 1, wherein the liquid phase deposition in the step (d) takes place in a supersaturated hydrofluosilicic acid ($H_2SiF_6$) aqueous solution.

11. The method as defined in claim 10, wherein the supersaturated $H_2SiF_6$ aqueous solution contains $H_2SiF_6$ in a concentration ranging between 1.3 and 2.2M, and boric acid in a concentration ranging between 0.001 and 0.02M.

12. The method as defined in claim 11, wherein the supersaturated $H_2SiF_6$ aqueous solution contains the boric acid in a concentration ranging between 0.0075 and 0.02M.

13. The method as defined in claim 1, wherein the step(d) is carried out at a temperature in the range of 10° C.–50° C.

14. The method as defined in claim 10, wherein the supersaturated $H_2SiF_6$ aqueous solution is prepared by mixing silicic acid ($SiO_2$:$xH_2O$) with a $H_2SiF_6$ aqueous solution containing $H_2SiF_6$ in a concentration ranging between 2 and 4M, and by removing the undissolved silica powder by filtration prior to adding water and a boric acid aqueous solution to the resulting filtrate.

15. The method as defined in claim 1 wherein the alkaline aqueous solution is a hydrogen peroxide aqueous solution.

* * * * *